(12) United States Patent
Yang

(10) Patent No.: US 12,293,979 B2
(45) Date of Patent: May 6, 2025

(54) MEMORY STRUCTURE INCLUDING ELASTIC MATERIAL BASED BUFFER COLUMN STRUCTURE NEAR CONTACT STRUCTURE TO IMPROVE STABILITY OF CONNECTION

(71) Applicant: CHANGXIN MEMORY TECHNOLOGIES, INC., Hefei (CN)

(72) Inventor: Cheng-Jer Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 536 days.

(21) Appl. No.: 17/575,143

(22) Filed: Jan. 13, 2022

(65) Prior Publication Data

US 2023/0015241 A1 Jan. 19, 2023

Related U.S. Application Data

(63) Continuation of application No. PCT/CN2021/120438, filed on Sep. 24, 2021.

(30) Foreign Application Priority Data

Jul. 13, 2021 (CN) .......................... 202110791853.1

(51) Int. Cl.
*H01L 23/00* (2006.01)
*G11C 7/06* (2006.01)
*H10D 1/68* (2025.01)

(52) U.S. Cl.
CPC .............. *H01L 23/562* (2013.01); *G11C 7/06* (2013.01); *H10D 1/692* (2025.01)

(58) Field of Classification Search
CPC .............. H01L 23/562; H01L 23/3171; H01L 23/52–53295; H01L 28/60; H01L 27/1052; G11C 7/06; H10B 99/00; H10B 12/033

See application file for complete search history.

(56) References Cited

U.S. PATENT DOCUMENTS 6,484,531 B1 11/2002 Hambleton
6,486,531 B2 11/2002 Oh
6,537,874 B2 3/2003 Nakamura
(Continued)

FOREIGN PATENT DOCUMENTS

CN 1941367 A 4/2007
CN 110034120 A 7/2019
(Continued)

*Primary Examiner* — Changhyun Yi
(74) *Attorney, Agent, or Firm* — Kilpatrick Townsend & Stockton LLP

(57) ABSTRACT

Embodiments provide a memory structure, including: a capacitive structure, provided with an upper electrode layer; a conductive column, arranged on the upper electrode layer, and in contact with and electrically connected to the upper electrode layer; a metal layer, arranged on a side of the conductive column away from the upper electrode layer, the conductive column being in contact with a surface of the metal layer facing the upper electrode layer; and at least one buffer column, spaced apart from the conductive column, in contact with the surface of the metal layer facing the upper electrode layer, and extending in a direction from the metal layer to the upper electrode layer.

19 Claims, 8 Drawing Sheets

(56) References Cited

U.S. PATENT DOCUMENTS

| | | | |
|---|---|---|---|
| 6,777,777 B1* | 8/2004 | Kar-Roy | H01L 23/5223 |
| | | | 257/532 |
| 7,091,538 B2 | 8/2006 | Natori | |
| 7,678,659 B2 | 3/2010 | Tu | |
| 10,446,566 B2 | 10/2019 | Parekh | |
| 10,903,220 B2 | 1/2021 | Parekh | |
| 2002/0024085 A1 | 2/2002 | Nakamura | |
| 2003/0109124 A1 | 6/2003 | Nakamura | |
| 2005/0110062 A1* | 5/2005 | Natori | H01L 28/65 |
| | | | 257/295 |
| 2006/0290002 A1* | 12/2006 | Arana | H01L 21/76898 |
| | | | 257/E21.597 |
| 2007/0072361 A1* | 3/2007 | Tu | H01L 28/60 |
| | | | 257/E21.011 |
| 2014/0225222 A1* | 8/2014 | Yu | H01L 27/1255 |
| | | | 257/532 |
| 2017/0077214 A1* | 3/2017 | Mudakatte | H01L 28/87 |
| 2019/0189629 A1 | 6/2019 | Parekh et al. | |
| 2020/0013792 A1 | 1/2020 | Parekh et al. | |
| 2020/0219826 A1* | 7/2020 | Wu | H01L 23/5386 |
| 2021/0143165 A1 | 5/2021 | Parekh et al. | |

FOREIGN PATENT DOCUMENTS

| | | |
|---|---|---|
| CN | 111968980 A | 11/2020 |
| TW | I658575 B | 5/2019 |

\* cited by examiner

MEMORY STRUCTURE INCLUDING ELASTIC MATERIAL BASED BUFFER COLUMN STRUCTURE NEAR CONTACT STRUCTURE TO IMPROVE STABILITY OF CONNECTION

CROSS-REFERENCE TO RELATED APPLICATIONS

This is a continuation of International Application No. PCT/CN2021/120438, filed on Sep. 24, 2021, and entitled "Memory Structure", which claims priority to Chinese Patent Application No. 202110791853.1, filed on Jul. 13, 2021, and entitled "Memory Structure". The disclosures of International Application No. PCT/CN2021/120438 and Chinese Patent Application No. 202110791853.1 are hereby incorporated by reference in their entireties.

TECHNICAL FIELD

Embodiments of the disclosure relate to, but not limited to, a memory structure.

BACKGROUND

A memory is an electronic component widely applied to various electronic devices. A conductive column is provided inside the memory and the conductive column is used for electrically connecting a capacitive structure to an upper metal layer.

However, in the related art, there is a problem of delamination between the conductive column and the capacitive structure, which causes the contact resistance between the conductive column and the capacitive structure to increase, or causes the power supply voltage of the capacitive structure to be unstable.

SUMMARY

Embodiments of the disclosure provide a memory structure, including: a capacitive structure, provided with an upper electrode layer; a conductive column, arranged on the upper electrode layer, and in contact with and electrically connected to the upper electrode layer; a metal layer, arranged on a side of the conductive column away from the upper electrode layer, the conductive column being in contact with a surface of the metal layer facing the upper electrode layer; and at least one buffer column, spaced apart from the conductive column, in contact with the surface of the metal layer facing the upper electrode layer, and extending in a direction from the metal layer to the upper electrode layer.

BRIEF DESCRIPTION OF THE DRAWINGS

One or more embodiments are exemplarily described by the figures that correspond to the one or more embodiments in the accompanying drawings. Unless otherwise stated, the figures in the accompanying drawings do not constitute any scale limitation.

DETAILED DESCRIPTION

As can be seen from the BACKGROUND, at present, the stability of the connection between the conductive column and the upper electrode layer needs to be improved.

Figure 1:
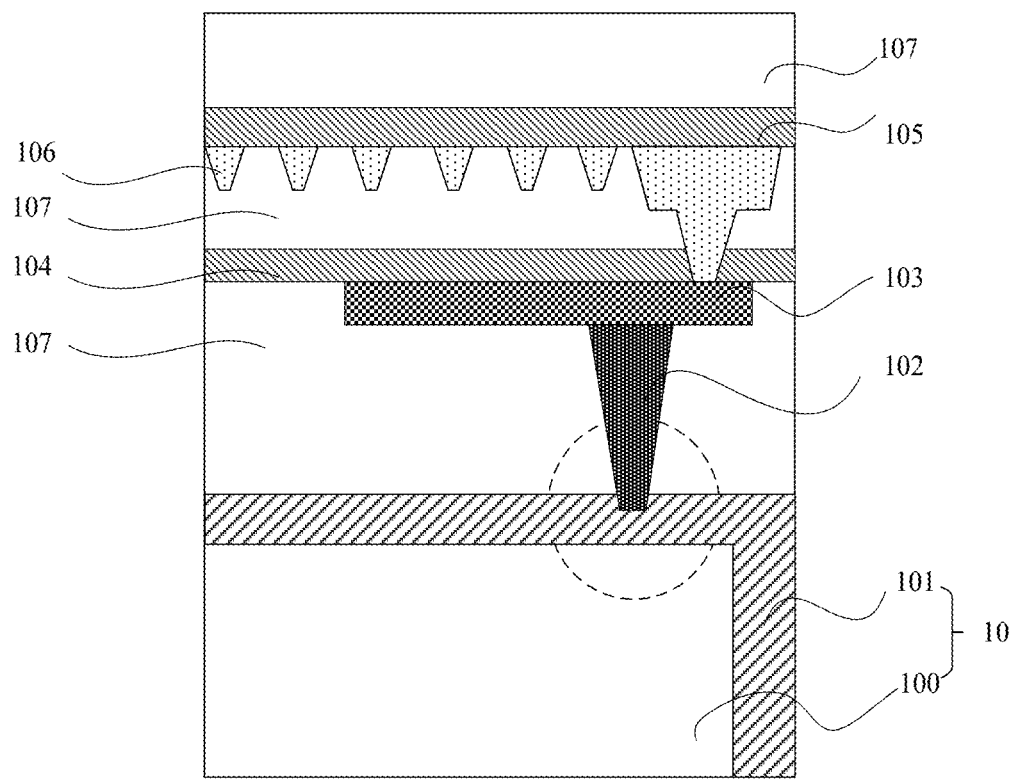
FIG. 1 is a schematic structural cross-sectional view corresponding to a memory structure.
Figure 2:
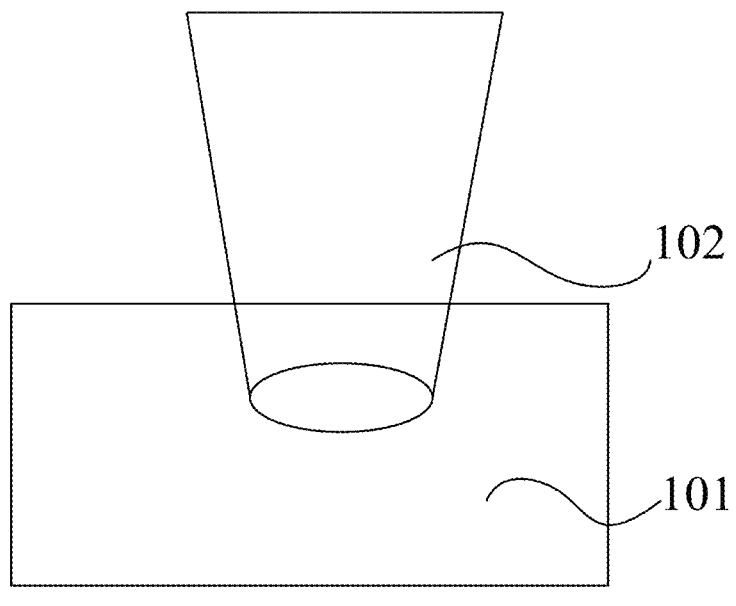
FIG. 2 is an enlarged view of a partial contact between a conductive column and an upper electrode layer corresponding to a memory structure.

FIG. 1 is a schematic structural cross-sectional view of a memory structure in the related art. Referring to FIG. 1, the memory structure includes a capacitive structure 10. The capacitive structure 10 includes a capacitive unit 100 and an upper electrode layer 101. The upper electrode layer 101 at least covers a top surface and a side surface of the capacitive unit 100. A conductive column 102 is provided on a surface of the upper electrode layer 101. The conductive column 102 is in contact with and electrically connected to the upper electrode layer 101. A metal layer 103 is arranged on a surface of a side of the conductive column 102 away from the upper electrode layer 101. A surface of a side of the metal layer 103 away from the conductive column 102 covers a first insulating layer 104. A second insulating layer 105 is provided at an interval on a surface of a side of the first insulating layer 104 away from the metal layer 103. A plurality of electrical connection layers 106 are provided at an interval between the first insulating layer 104 and the second insulating layer 105. At least one electrical connection layer 106 passes through the first insulating layer 104 to be in contact with and electrically connected to the metal layer 103. A dielectric layer 107 is further provided on surfaces of the first insulating layer 104 and the second insulating layer 105. FIG. 2 is an enlarged view of a partial contact between the conductive column 102 and the upper electrode layer 101.

After analysis, it is found that the metal layer 103 and the upper electrode layer 101 are only electrically connected through the conductive column 102. A contact area only includes the end of the conductive column 102. When the memory structure operates and generates heat or is subjected to an external force, the conductive column 102 tends to be delaminated from the upper electrode layer 101. As a result, a voltage provided by the capacitive structure 10 will become unstable, and a contact resistance between the conductive column 102 and the upper electrode layer 101 will be increased.

Stress includes external stress and internal stress. A main source of the external stress is an external force applied to the memory from outside, for example, a pressure applied to the memory from a machine during soldering in a process of mounting the memory on an electronic product. When the external stress increases to a particular degree, the conductive column will be delaminated from the upper electrode layer, and the contact impedance between the upper electrode layer and the metal layer will be further increased, or a supply voltage provided by the capacitive structure will further become unstable. A main source of the internal stress is inside of the memory. For example, when an internal temperature of the memory changes, the internal materials of the memory undergo thermal expansion and contraction, etc., and the material properties between film layers, such as lattice constants of layers, are different. As a result, the internal stress will squeeze the conductive column, and the conductive column will further be delaminated from the upper electrode layer.

In addition, with the continuous miniaturization of devices, sizes of the conductive column 102 and the upper electrode layer 101 decreases correspondingly, such that a contact area between the conductive column 102 and the upper electrode layer 101 will correspondingly decreases. When the contact area between the conductive column 102 and the upper electrode layer 101 decreases, the conductive column 102 may further tend to be delaminated from the upper electrode layer 101.

To resolve the foregoing problem, embodiments of the disclosure provide a memory structure. A buffer column is provided on a surface of a metal layer facing an upper electrode layer. In this way, when the conductive column is subjected to the internal stress or the external stress, the buffer column will bear partial stress, to reduce stress that the conductive column bears, to further improve the stability of the connection between the conductive column and the upper electrode layer; and thus, a voltage provided by the capacitive structure will be stable.

For clearer descriptions of the objectives, technical solutions, and advantages of the embodiments of the disclosure, the embodiments of the disclosure are described in detail hereinafter with reference to the accompanying drawings. However, it is understandable to those of ordinary skill in the art that many technical details are provided for a reader to better understand the disclosure in the embodiments of the disclosure. However, even in the absence of these technical details and various changes and modifications based on the following embodiments, the technical solution claimed in the disclosure may be implemented.

Figure 3:
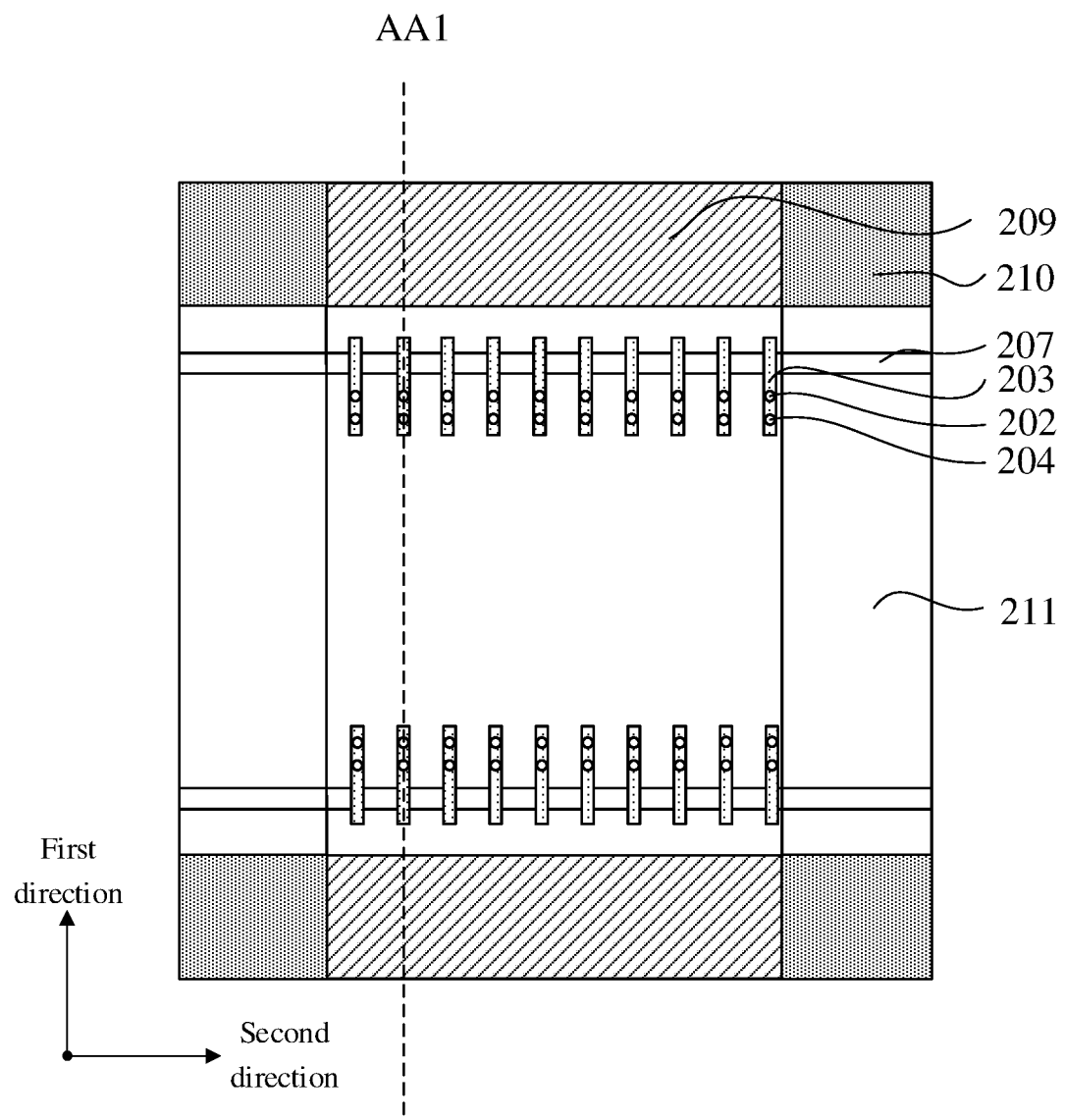
FIG. 3 is a schematic structural top view corresponding to a memory structure according to an embodiment of the disclosure.
Figure 4:
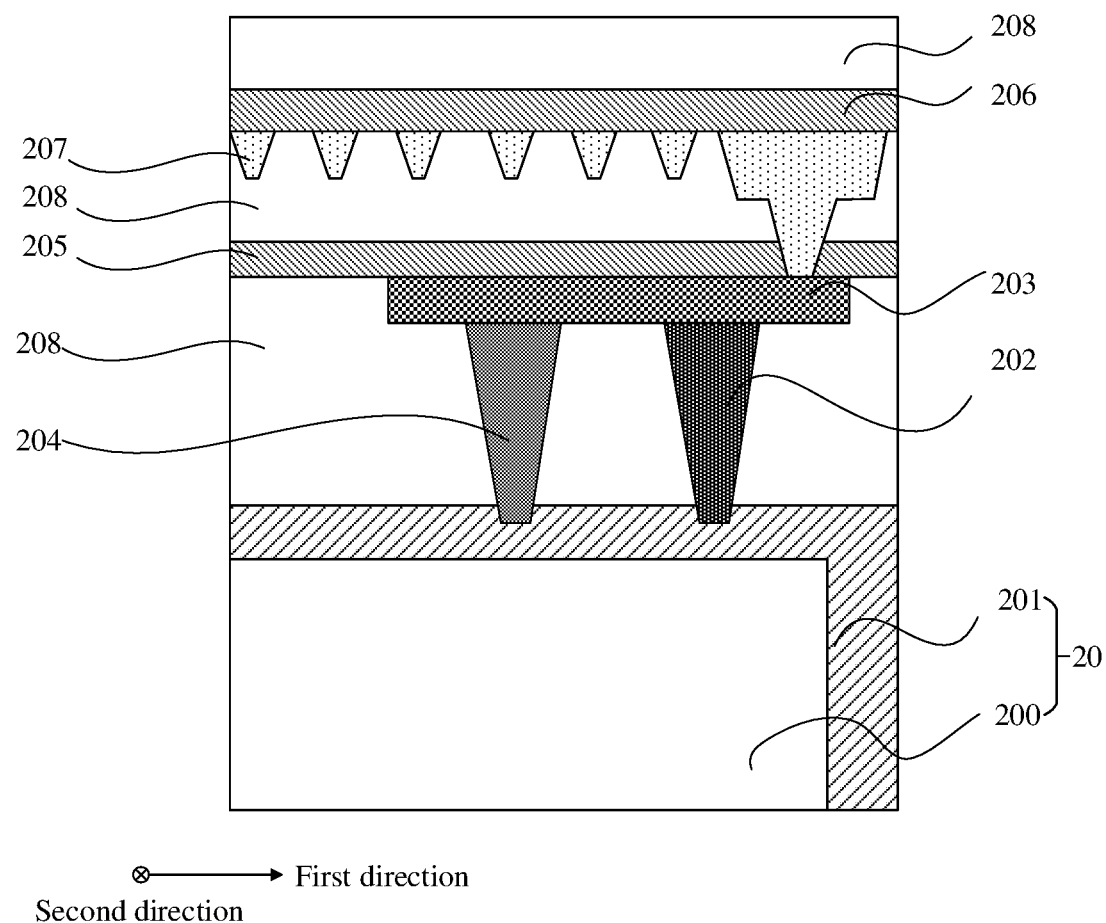
FIG. 4 is a schematic structural cross-sectional view corresponding to a memory structure according to an embodiment of the disclosure.
Figure 5:
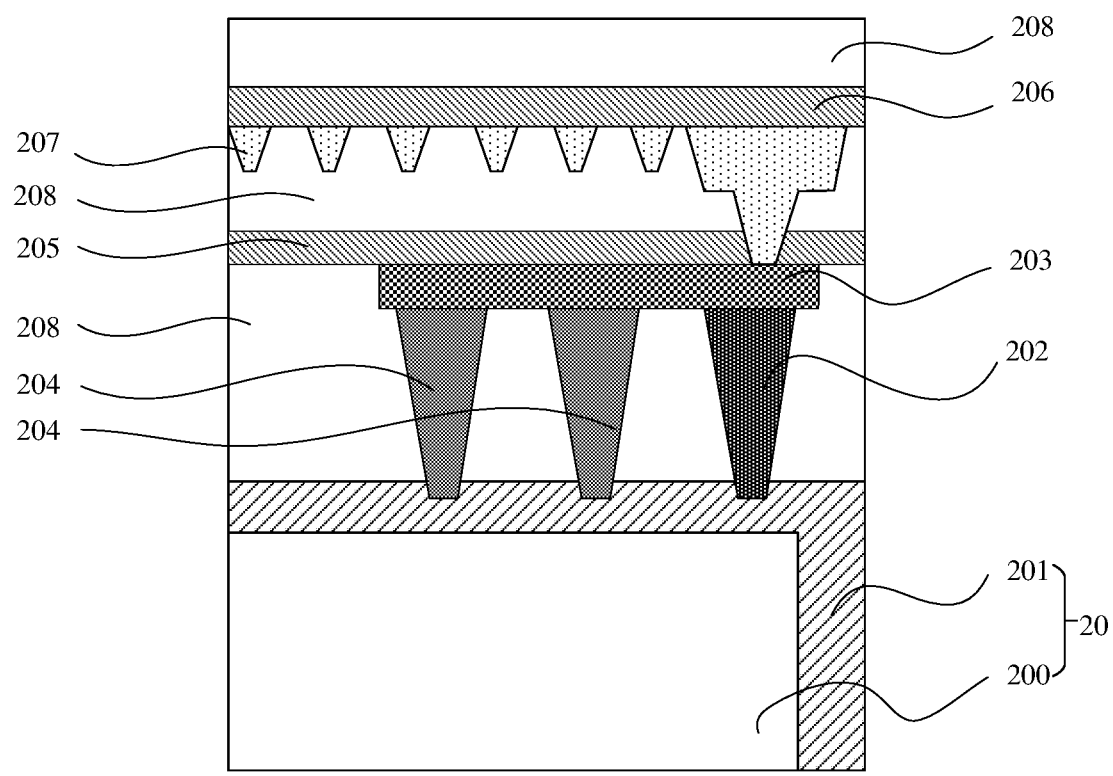
FIG. 5 is another schematic structural cross-sectional view corresponding to a memory structure according to an embodiment of the disclosure.

FIG. 3 is a schematic structural top view of a memory structure. FIG. 4 is a schematic structural cross-sectional view cut in a direction AA1 in FIG. 3. FIG. 5 is another schematic structural cross-sectional view cut in the direction AA1 in FIG. 3.

Referring to FIGS. 3 to 5, the memory structure includes: a capacitive structure 20, provided with an upper electrode layer 201; a conductive column 202, arranged on the upper electrode layer 201, and in contact with and electrically connected to the upper electrode layer 201; a metal layer 203, arranged on a side of the conductive column 202 away from the upper electrode layer 201, the conductive column 202 being in contact with a surface of the metal layer 203 facing the upper electrode layer 201; and at least one buffer column 204, spaced apart from the conductive column 202, in contact with the surface of the metal layer 203 facing the upper electrode layer 201, and extending in a direction from the metal layer 203 to the upper electrode layer 201.

The buffer column 204 is additionally provided on the surface of the metal layer 203 facing the upper electrode layer 201. When the conductive column 202 is subjected to stress, the buffer column 204 may bear partial stress, to further improve the stability of the connection between the conductive column 202 and the upper electrode layer 201.

The memory structure provided in the embodiment is described below in further detail with reference to the accompanying drawings.

In the embodiment, the capacitive structure 20 may include: a capacitive unit 200, at least including a lower electrode layer and a capacitor dielectric layer arranged on a surface of the lower electrode layer; and an upper electrode layer 201, covering a top surface and a side surface of the capacitive unit 200. Further, the capacitive unit 200 may further include an upper electrode plate. The upper electrode plate may be arranged on a surface of the capacitive dielectric layer. The upper electrode layer 201 may be arranged on a surface of the upper electrode plate. The capacitive unit 200 may be used for storing electric charges.

The upper electrode layer 201 may be made of a conductive material such as polycrystalline silicon, doped polycrystalline silicon or metal. The upper electrode layer 201 may cover the surface and the side surface of the capacitive unit 200. The upper electrode layer 201 may be used for transferring the electric charges stored in the capacitive unit 200 to the outside.

A material of the conductive column 202 may be a conductive material such as copper, aluminum or tungsten. In the embodiment, the conductive column 202 may penetrate the surface of the upper electrode layer 201 to be in contact with and electrically connected to the inside of the upper electrode layer 201. In other embodiments, the conductive column 202 may be only in contact with and electrically connected to the surface of the upper electrode layer 201. In some embodiments, in a direction parallel to a first direction, a width of the conductive column 202 may gradually decrease from a side away from the upper electrode layer 201 to a side close to the upper electrode layer 201. In some other embodiments, in the direction parallel to the first direction, a width of the side of the conductive column 202 away from the upper electrode layer 201 may be equal to a width of the side close to the upper electrode layer 201.

A material of the metal layer 203 may be a conductive material such as copper, aluminum or tungsten. As shown in FIG. 3, the memory structure may include a plurality of metal layers 203 arranged in a second direction. Each metal layer 203 may extend in the first direction. The second direction may be different from the first direction. In the embodiment, the second direction may be perpendicular to the first direction.

The buffer column 204 and the conductive column 202 may be arranged on the metal layer 203 in the first direction. In the direction from the metal layer 203 to the upper electrode layer 201, a length of the buffer column 204 may be equal to a length of the conductive column 202. When the length of the buffer column 204 is equal to the length of the conductive column 202, a conductive column via and a buffer column via may be formed in one step, thereby reducing process steps.

In some embodiments, in the direction parallel to the first direction, a width of the buffer column 204 may gradually decrease from the side away from the upper electrode layer 201 to the side close to the upper electrode layer 201. In some other embodiments, in the direction parallel to the first direction, a width of a side of the buffer column 204 away from the upper electrode layer 201 may be equal to a width of a side close to the upper electrode layer 201.

In the embodiment, a material of the buffer column 204 may be the same as the material of the conductive column 202. Since the buffer column 204 and the conductive column 202 are made of the same material, the buffer column 204 and the conductive column 202 may be manufactured at the same time in a one-step production process. The material of the buffer column 204 may also be a conductive material. A contact area between the upper electrode layer 201 and the metal layer 203 will be increased, so that the contact resistance between the metal layer 203 and the upper electrode layer 201 can be reduced.

In addition, the material of the buffer column 204 may include an elastic material. Specifically, the material of the buffer column 204 may be polyimide. The material of the buffer column 204 may be an elastic material. When the conductive column 202 is subjected to stress, the buffer column 204 may absorb partial stress, to reduce the stress that the body of the conductive column 202 bears, to further improve the stability of the connection between the conductive column 202 and the upper electrode layer 201. Polyimide has excellent mechanical and bonding properties, so that the connection between the upper electrode layer 201 and the metal layer 203 will be more secure.

In the embodiment, for each metal layer 203, there may be one buffer column 204. When the conductive column 202 is subjected to stress, the buffer column 204 may share stress on the conductive column 202, to further improve the stability of the connection between the conductive column 202 and the upper electrode layer 201.

In some embodiments, the metal layer 203 may have a symmetry axis. The symmetry axis may be parallel to the second direction. An extension length of the metal layer 203 in the first direction may be symmetrical about the symmetry axis. The buffer column 204 and the conductive column 202 may be symmetrically arranged about the symmetry axis. Since the buffer column 204 and the conductive column 202 are symmetrically arranged, the buffer column 204 and the conductive column 202 may uniformly share the internal stress or the external stress, to reduce the stress that the conductive column 202 bears, and to further improve the stability of the connection between the conductive column 202 and the upper electrode layer 201. In some other embodiments, the buffer column 204 and the conductive column 202 may be not symmetrically arranged about the symmetry axis of the metal layer 203.

It may be understood that in some other embodiments, for each metal layer 203, there may be a plurality of buffer columns 204, and the plurality of buffer columns 204 may be arranged at an interval on the metal layer 203. Specifically, in some embodiments, the plurality of buffer columns 204 may be arranged at an interval in the first direction on a surface of the metal layer 203 close to the upper electrode layer 201. In the direction from the metal layer 203 to the upper electrode layer 201, a length of each of the plurality of buffer columns 204 may be equal to the length of the conductive column 202. When the lengths of the plurality of buffer columns 204 are all equal to the length of the conductive column 202, a conductive column via and a buffer column via may be formed in one step, thereby reducing process steps in a production process.

It may be understood that in some embodiments, materials of the plurality of buffer columns 204 may all be conductive materials or elastic materials. In another embodiment, materials of some buffer columns 204 may be conductive materials, and materials of some buffer columns 204 may be elastic materials. In some embodiments, when the materials of some buffer columns 204 are conductive materials and the materials of some buffer columns 204 are elastic materials, all the conductive materials may be the same material, and all the elastic materials may be the same material, thereby reducing the types of materials to facilitate production.

Further, referring to FIG. 3, the memory structure may further include a Sensor Amplifier (SA) 209. In the embodiment, the metal layer 203 may be arranged adjacent to the SA 209. The conductive column 202 may be arranged on a side of the metal layer 203 close to the SA 209, and the buffer column 204 may be arranged on a side of the metal layer 203 away from the SA 209. With such an arrangement, as the conductive column 202 transfers a signal to the SA 209, a loss in a transmission process will be reduced, thereby reducing a transmission time of the signal. In some other embodiments, the buffer column 204 may be arranged on the side of the metal layer 203 close to the SA 209, and the conductive column 202 may be arranged on the side of the metal layer 203 away from the SA 209. Therefore, an area inside the memory structure protected by the SA 209 will be increased, to better improve the stability of the connection between the conductive column 202 and the upper electrode layer 201, thereby further reducing a possibility of the contact resistance between the conductive column 202 and the upper electrode layer 201 to be increased or a power supply voltage of the capacitive structure 20 to become unstable.

Specifically, the memory structure may include a storage unit. The metal layer 203, the conductive column 202, and the buffer column 204 may all be arranged in the storage unit. The SA 209 may be arranged on two opposite sides of the storage unit.

The memory structure may further include: a Sub Wordline Conjunction (SWC) area 210, arranged on two opposite sides of the SA 209; and a Sub Wrodline Drive (SWD) area 211, arranged on two opposite sides of the storage unit, and adjacent to the corresponding SWC area 210.

In the embodiment, the memory structure may further include a first insulating layer 205, a second insulating layer 206, an electrical connection layer 207, and a dielectric layer 208.

The first insulating layer 205 may cover a surface of a side of the metal layer 203 away from the upper electrode layer 201. In the direction parallel to the first direction, an extension length of the first insulating layer 205 may be greater than the extension length of the metal layer 203. The first insulating layer 205 may be an inoxidizable material such as silicon nitride, to protect the surface of the side of the metal layer 203 away from the upper electrode layer 201 from oxidation.

The second insulating layer 206 may be spaced apart from the first insulating layer 205 in a direction from the upper electrode layer 201 to the metal layer 203. The second insulating layer 206 may be an inoxidizable material such as silicon nitride. A material of the second insulating layer 206 may be consistent with a material of the first insulating layer 205. The second insulating layer 206 may protect a surface of the electrical connection layer 207 from oxidation.

A plurality of electrical connection layers 207 may be arranged in different layers from the metal layer 203, and may be arranged in the first direction on a side of the second insulating layer 206 close to the first insulating layer 205. Each electrical connection layer 207 may extend in the second direction. The second direction may be different from the first direction. At least one electrical connection layer 207 may pass through the first insulating layer 205 to be in contact with and electrically connected to the metal layer 203. The electrical connection layer 207 may be used for transferring a voltage of the capacitive structure 20.

Specifically, in addition to the storage unit, the electrical connection layer 207 may further extend to an area in which the SWD area 211 is arranged.

The dielectric layer 208 may be arranged on the surface of the upper electrode layer 201, and the conductive column 202 and the buffer column 204 may both be arranged in the dielectric layer 208. The dielectric layer 208 may be made of a material such as silicon oxide, to protect the conductive column 202, the metal layer 203, the buffer column 204, and the electrical connection layer 207 from reacting with air.

In the embodiment, one or more buffer columns 204 having extension lengths equal to an extension length of the conductive column 202 in the direction from the metal layer 203 to the upper electrode layer 201 may be additionally arranged on the metal layer 203, and share a pressure on the conductive column 202 to improve the stability of the connection between the conductive column 202 and the upper electrode layer 201.

Another embodiment of the disclosure further provides a memory structure. The memory structure provided in the embodiment is approximately the same as that in the foregoing embodiments. A main difference may lie in that in a direction from the metal layer to an upper electrode layer, a length of the buffer column may be less than a length of the conductive column. The memory structure provided in the another embodiment of the disclosure is described below with reference to the accompanying drawings. It needs to be noted that reference may be made to corresponding description in the foregoing embodiments for parts that are the same as or correspond to the foregoing embodiments, which are not described below again.

Figure 6:
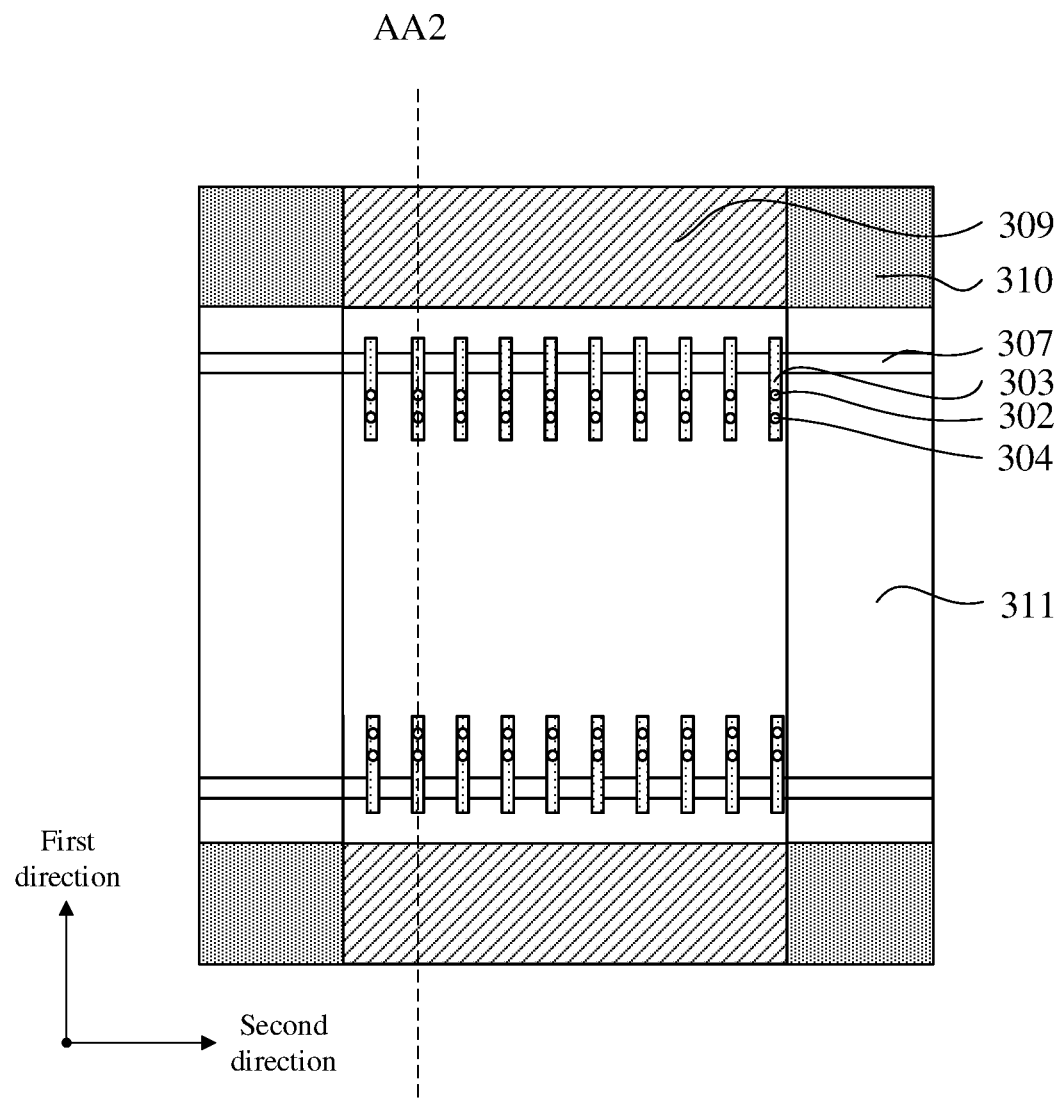
FIG. 6 is a schematic structural top view corresponding to a memory structure according to another embodiment of the disclosure.
Figure 7:
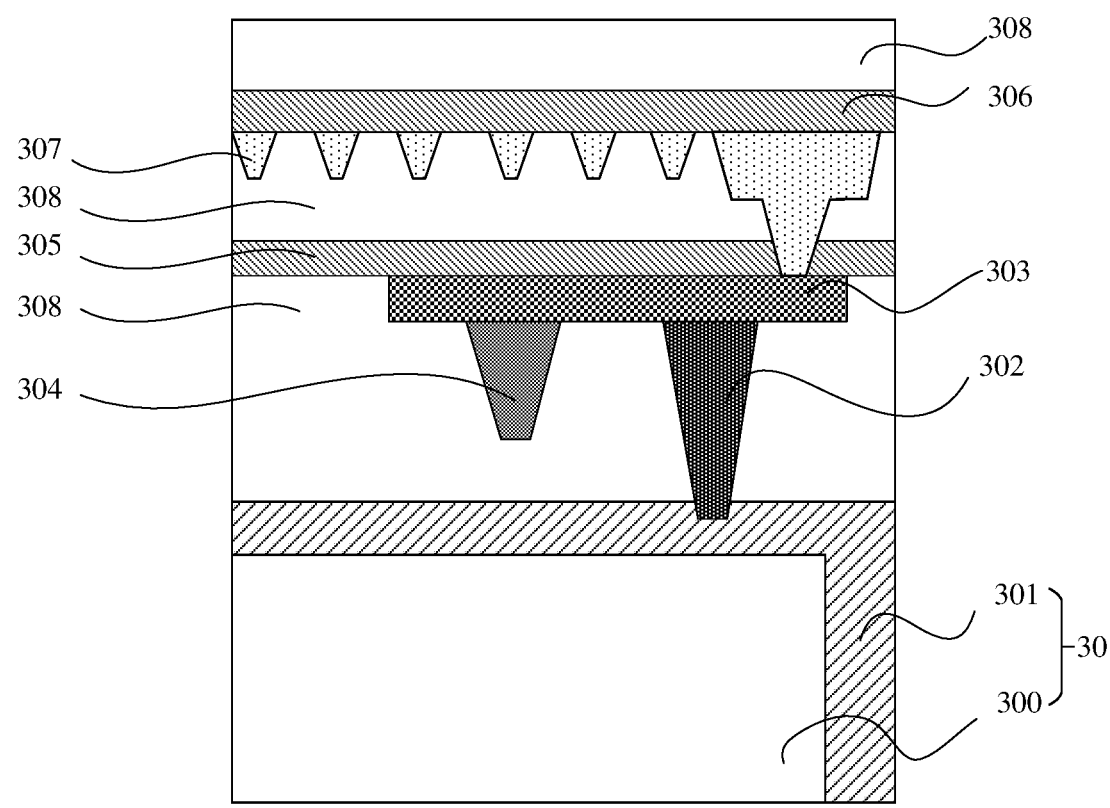
FIG. 7 is a schematic structural cross-sectional view corresponding to a memory structure according to another embodiment of the disclosure.
Figure 8:
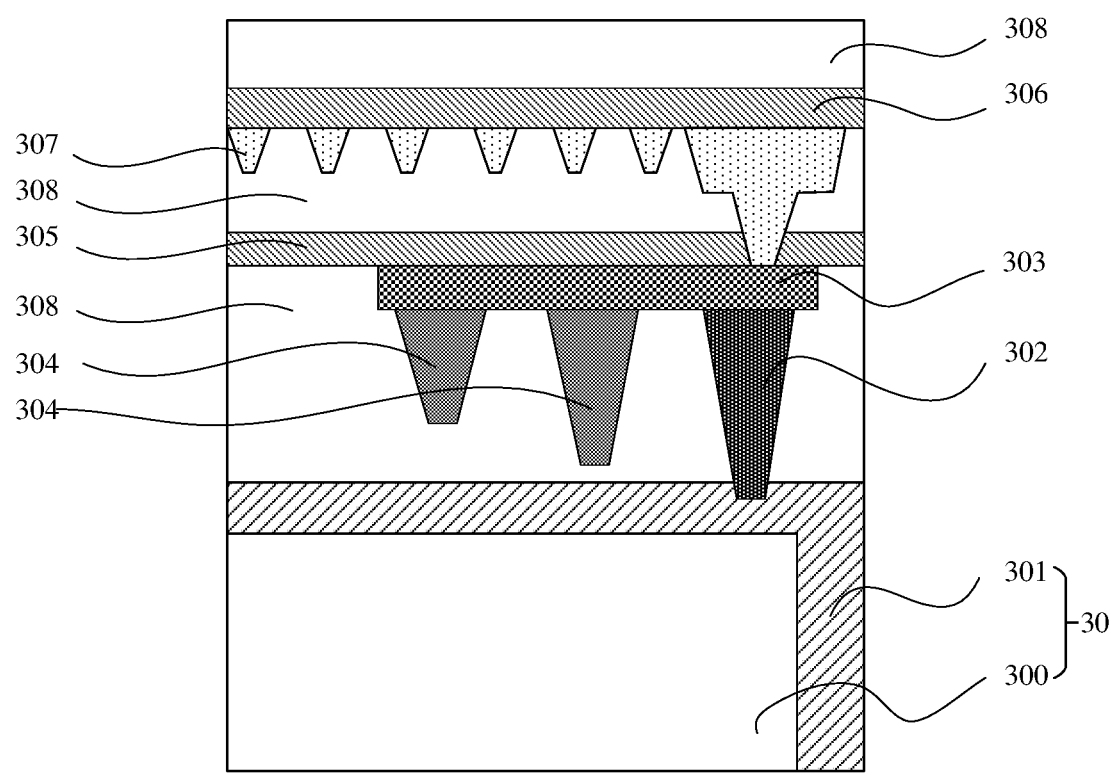
FIG. 8 is another schematic structural cross-sectional view corresponding to a memory structure according to another embodiment of the disclosure.

FIG. 6 is a schematic structural top view corresponding to a memory structure according to another embodiment of the disclosure. FIG. 7 is a schematic structural cross-sectional view cut in a direction AA2 in FIG. 6. FIG. 8 is another schematic structural cross-sectional view cut in the direction AA2 in FIG. 6.

Referring to FIGS. 6 to 8, the memory structure may include a capacitive structure 30. The capacitive structure 30 may include a capacitive unit 300, an upper electrode layer 301, a conductive column 302, a metal layer 303, a buffer column 304, a first insulating layer 305, a second insulating layer 306, an electrical connection layer 307, and a dielectric layer 308.

The memory structure may further include an SA 309, an SWC area 310, and an SWD area 311.

In the embodiment, in a direction from the metal layer 303 to the upper electrode layer 301, a length of the buffer column 304 may be less than a length of the conductive column 302. In the case that a material of the buffer column 304 is an elastic material, because the buffer column 304 and the upper electrode layer 301 are made of different materials, when the memory structure undergoes thermal expansion, the buffer column 304 will not press the upper electrode layer 301, thereby protecting the upper electrode layer 301.

In some embodiments, in the direction from the metal layer 303 to the upper electrode layer 301, the length of the buffer column 304 may be at least ½ of the length of the conductive column 302. When the length of the buffer column 304 is ½ of the length of the conductive column 302, the material use can be reduced while the stability of the memory structure can be ensured.

In some embodiments, the material of the buffer column 304 is the elastic material. In a case that the material of the buffer column 304 is the elastic material, if the conductive column 302 is subjected to stress, the buffer column 304 may absorb partial stress. The buffer column 304 may share partial stress on the conductive column 302, to reduce the stress that the conductive column 302 bears, to further improve the stability of the connection between the conductive column 302 and the upper electrode layer 301.

It may be understood that in some embodiments, for each metal layer 303, there may be a plurality of buffer columns 304, and the plurality of buffer columns 304 may be arranged at an interval on the metal layer 303. In some embodiments, the plurality of buffer columns 304 may be arranged on a same side of the conductive column 302, and in a direction from the plurality of buffer columns 304 to the conductive column 302, lengths of the plurality of buffer columns 304 may be increased sequentially in the direction from the metal layer 303 to the upper electrode layer 301, so that when the memory structure is subjected to stress, under the protection of the plurality of buffer columns 304, the stress applied to the conductive column 302 can be reduced. Thus, the stability of the connection between the conductive column 302 and the upper electrode layer 301 can be further protected. In some other embodiments, the plurality of buffer columns 304 may be arranged on a same side of the conductive column 302, and in the direction from the metal layer 303 to the upper electrode layer 301, the plurality of buffer columns 304 may have equal lengths. In still some embodiments, the lengths of the plurality of buffer columns 304 may be the same, and may be less than the length of the conductive column 302. When the plurality of buffer columns 304 may have equal lengths, similarly, a plurality of buffer column vias may be formed in a one-step process.

When the plurality of buffer columns 304 are provided on a surface of the metal layer 303 facing the upper electrode layer 301, in some embodiments, the materials of the buffer columns 304 may be made of the same elastic material, so that it will not be necessary to change the materials of the buffer columns 304 in a processing process to facilitate production. When the plurality of buffer columns 304 of an elastic material are arranged, more negative impact caused by stress can be mitigated, to further improve the stability of the connection between the conductive column 302 and the upper electrode layer 301. In some other embodiments, the materials of the buffer columns 304 may be made of different elastic materials. In a direction from a position close to the SA 309 to a position away from the SA 309, elastic moduli of the materials of the buffer columns 304 may sequentially decrease. In this way, under the protection of the plurality of buffer columns 304, the stress applied to the conductive column 302 can be reduced. Since the buffer column 304 close to the SA 309 has the largest elastic modulus, the force capacity of the memory structure can be increased.

In the embodiment, the plurality of buffer columns 304 with the lengths less than the length of the conductive column 302 may be arranged on the metal layer 303, so that the phenomenon of the conductive column 302 being delaminated from the upper electrode layer 301 can be mitigated while material use can be reduced.

A person of ordinary skill in the art may understand that the foregoing implementations are specific embodiments for implementing the disclosure, and in actual applications, various changes can be made thereto in forms and details without departing from the spirit and scope of the disclosure. Any person skilled in the art can make changes and modifications without departing from the spirit and scope of the disclosure, and the scope of protection of the disclosure should be as defined by the scope of the claims.

The invention claimed is:

1. A memory structure, comprising:
a capacitive structure, provided with an upper electrode layer;
a conductive column, arranged on the upper electrode layer, and in contact with and electrically connected to the upper electrode layer;
a metal layer, arranged on a side of the conductive column away from the upper electrode layer, the conductive column being in contact with a surface of the metal layer facing the upper electrode layer; and
at least one buffer column, spaced apart from the conductive column, in contact with the surface of the metal layer facing the upper electrode layer, and extending in a direction from the metal layer to the upper electrode layer;
wherein a material of the buffer column comprises an elastic material.

2. The memory structure of claim 1, wherein the at least one buffer column comprises one buffer column.

3. The memory structure of claim 2, wherein the metal layer has a symmetry axis, and the buffer column and the conductive column are symmetrically arranged about the symmetry axis.

4. The memory structure of claim 1, wherein in the direction from the metal layer to the upper electrode layer, a length of the buffer column is equal to a length of the conductive column.

5. The memory structure of claim 1, wherein the material of the buffer column comprises polyimide.

6. The memory structure of claim 1, wherein the at least one buffer column comprises a plurality of buffer columns, and the plurality of buffer columns are arranged at an interval on the metal layer.

7. The memory structure of claim 6, wherein the plurality of buffer columns are arranged on a same side of the conductive column, and in a direction from the plurality of buffer columns to the conductive column, lengths of the plurality of buffer columns are increased successively in the direction from the metal layer to the upper electrode layer.

8. The memory structure of claim 7, wherein the lengths of the plurality of buffer columns are less than a length of the conductive column.

9. The memory structure of claim 8, wherein a length of each of the plurality of buffer columns is at least ½ of the length of the conductive column.

10. The memory structure of claim 6, wherein the plurality of buffer columns are arranged on a same side of the conductive column, and in a direction from the metal layer to the upper electrode layer, the plurality of buffer columns have equal lengths.

11. The memory structure of claim 1, further comprising: a sensor amplifier, wherein the conductive column is arranged on a side of the metal layer close to the sensor amplifier, and the buffer column is arranged on a side of the metal layer away from the sensor amplifier.

12. The memory structure of claim 1, further comprising: a dielectric layer, wherein the dielectric layer is arranged on a surface of the upper electrode layer, and the conductive column and the buffer column are arranged in the dielectric layer.

13. The memory structure of claim 1, wherein each of the metal layer extends in a first direction, and the buffer column and the conductive column are arranged in the first direction.

14. The memory structure of claim 13, further comprising: an electrical connection layer, wherein the electrical connection layer is arranged in a different layer from the metal layer, each of the electrical connection layer extends in a second direction, and the second direction is different from the first direction.

15. The memory structure of claim 14, further comprising: a first insulating layer and a second insulating layer; wherein the first insulating layer covers a surface of a side of the metal layer away from the upper electrode layer, and the second insulating layer is spaced apart from the first insulating layer in a direction from the upper electrode layer to the metal layer.

16. The memory structure of claim 1, further comprising: a sensor amplifier, wherein the buffer column is arranged on a side of the metal layer close to the sensor amplifier, and the conductive column is arranged on a side of the metal layer away from the sensor amplifier.

17. The memory structure of claim 16, wherein a material of the first insulating layer is consistent with a material of the second insulating layer; and the material of the first insulating layer and the material of the second insulating layer comprise an inoxidizable material.

18. The memory structure of claim 1, wherein a material of the upper electrode layer comprises polycrystalline silicon, doped polycrystalline silicon or metal.

19. The memory structure of claim 1, wherein in the direction from the metal layer to the upper electrode layer, a length of the buffer column is less than a length of the conductive column.

* * * * *